(12) United States Patent
Kanskar

(10) Patent No.: US 10,014,664 B2
(45) Date of Patent: Jul. 3, 2018

(54) FLARED LASER OSCILLATOR WAVEGUIDE

(71) Applicant: nLIGHT, Inc., Vancouver, WA (US)

(72) Inventor: Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/377,813

(22) Filed: Dec. 13, 2016

(65) Prior Publication Data

US 2017/0222402 A1 Aug. 3, 2017

Related U.S. Application Data

(63) Continuation of application No. 14/855,710, filed on Sep. 16, 2015, now Pat. No. 9,553,424, which is a continuation of application No. 14/011,661, filed on Aug. 27, 2013, now Pat. No. 9,166,369.

(60) Provisional application No. 61/810,261, filed on Apr. 9, 2013.

(51) Int. Cl.
*H01S 5/20* (2006.01)
*H01S 5/028* (2006.01)
*H01S 5/10* (2006.01)
*H01S 5/065* (2006.01)

(52) U.S. Cl.
CPC .......... *H01S 5/2036* (2013.01); *H01S 5/0287* (2013.01); *H01S 5/0651* (2013.01); *H01S 5/1003* (2013.01)

(58) Field of Classification Search
CPC .... H01S 5/2036; H01S 5/1003; H01S 5/0287; H01S 5/1014; H01S 2301/16; H01S 5/2018; H01S 5/1203; H01S 2301/18
See application file for complete search history.

(56) References Cited

U.S. PATENT DOCUMENTS

| | | | |
|---|---|---|---|
| 4,856,017 A | 8/1989 | Ungar | |
| 4,942,585 A | 7/1990 | Ungar | |
| 4,977,567 A | 12/1990 | Hanke | |

(Continued)

FOREIGN PATENT DOCUMENTS

| | | |
|---|---|---|
| CN | 1411114 | 4/2003 |
| CN | 1415128 | 4/2003 |

(Continued)

OTHER PUBLICATIONS

Agrawal, "Lateral Analysis of Quasi-Index-Guided Injection Lasers: Transition from Gain to Index Guiding," Journal of Lightwave Technology, LT-2(4):537-543 (Aug. 1984) (copy attached).

(Continued)

*Primary Examiner* — Dung Nguyen
(74) *Attorney, Agent, or Firm* — Klarquist Sparkman, LLP

(57) ABSTRACT

A broad area semiconductor diode laser device includes a multimode high reflector facet, a partial reflector facet spaced from said multimode high reflector facet, and a flared current injection region extending and widening between the multimode high reflector facet and the partial reflector facet, wherein the ratio of a partial reflector facet width to a high reflector facet width is n:1, where n>1. The broad area semiconductor laser device is a flared laser oscillator waveguide delivering improved beam brightness and beam parameter product over conventional straight waveguide configurations.

20 Claims, 7 Drawing Sheets

(56) References Cited

U.S. PATENT DOCUMENTS

| | | | |
|---|---|---|---|
| 5,003,550 | A | 3/1991 | Welch et al. |
| 5,032,219 | A | 7/1991 | Buchmann et al. |
| 5,228,049 | A | 7/1993 | Paoli |
| 5,337,328 | A | 8/1994 | Lang et al. |
| 5,392,308 | A | 2/1995 | Welch et al. |
| 5,499,261 | A | 3/1996 | Welch et al. |
| 5,517,517 | A | 5/1996 | Liou |
| 5,539,571 | A | 7/1996 | Welch et al. |
| 5,602,864 | A | 2/1997 | Welch et al. |
| 5,677,920 | A | 10/1997 | Waarts et al. |
| 5,794,839 | A | 8/1998 | Kimura et al. |
| 5,914,978 | A | 6/1999 | Welch et al. |
| 6,014,396 | A | 1/2000 | Osinski et al. |
| 6,124,973 | A | 9/2000 | Du et al. |
| 6,130,903 | A | 10/2000 | Moloney et al. |
| 6,148,013 | A | 11/2000 | Geels et al. |
| 6,174,748 | B1 | 1/2001 | Jeon et al. |
| 6,181,721 | B1 | 1/2001 | Geels et al. |
| 6,301,037 | B1 | 10/2001 | Fischer et al. |
| 6,509,547 | B1 | 1/2003 | Bernstein et al. |
| 6,525,872 | B1 | 2/2003 | Ziari et al. |
| 6,782,024 | B2 | 8/2004 | Schmidt et al. |
| 6,798,815 | B2 | 9/2004 | Schmidt et al. |
| 6,810,054 | B2 | 10/2004 | Sousa et al. |
| 6,816,531 | B1 | 11/2004 | Rossin et al. |
| 6,862,300 | B1 | 3/2005 | Traut et al. |
| 6,928,097 | B2 | 8/2005 | Chida |
| 7,245,803 | B2 | 7/2007 | Gunn, III et al. |
| 7,457,338 | B2 * | 11/2008 | Mawst ............... B82Y 20/00 257/E33.008 |
| 7,602,828 | B2 | 9/2009 | Rossin et al. |
| 7,623,555 | B2 | 11/2009 | Traut et al. |
| 7,697,589 | B2 | 4/2010 | Volodin et al. |
| 7,715,457 | B2 | 5/2010 | Schmidt et al. |
| 7,733,932 | B2 | 6/2010 | Faybishenko |
| 7,817,693 | B2 | 10/2010 | Alahautala et al. |
| 8,111,727 | B2 | 2/2012 | Harder et al. |
| 8,437,583 | B2 | 5/2013 | Ban |
| 8,442,085 | B2 | 5/2013 | Sorimachi et al. |
| 8,615,029 | B2 | 12/2013 | Ovtchinnikov et al. |
| 9,166,369 | B2 | 10/2015 | Kanskar |
| 9,214,786 | B2 | 12/2015 | Hemenway et al. |
| 9,627,852 | B2 | 4/2017 | Hemenway et al. |
| 2002/0037021 | A1 | 3/2002 | Ohkubo |
| 2002/0105718 | A1 | 8/2002 | Bacher et al. |
| 2002/0181525 | A1 | 12/2002 | Kasukawa |
| 2003/0057427 | A1 | 3/2003 | Chida |
| 2003/0219054 | A1 | 11/2003 | Capasso et al. |
| 2005/0013337 | A1 | 1/2005 | Jung |
| 2006/0023173 | A1 | 2/2006 | Mooradian et al. |
| 2007/0053397 | A1 | 3/2007 | Burckel et al. |
| 2008/0112450 | A1 | 5/2008 | Krakowski |
| 2008/0212632 | A1 | 9/2008 | Eberhard et al. |
| 2009/0201962 | A1 | 8/2009 | Satoh et al. |
| 2009/0245315 | A1 | 10/2009 | Faybishenko |
| 2010/0097680 | A1 | 4/2010 | Naftali et al. |
| 2011/0299172 | A1 | 12/2011 | Mikhailov et al. |
| 2012/0069861 | A1 | 3/2012 | Neuberger |
| 2012/0177077 | A1 | 7/2012 | Erbert et al. |
| 2013/0089115 | A1 | 4/2013 | Kanskar |
| 2014/0301421 | A1 | 10/2014 | Kanskar |

FOREIGN PATENT DOCUMENTS

| | | |
|---|---|---|
| CN | 1672303 | 9/2005 |
| CN | 101714746 | 5/2010 |
| CN | 101490915 | 9/2010 |
| CN | 101833150 | 9/2010 |
| CN | 102255238 | 11/2011 |
| CN | 102401949 | 4/2012 |
| JP | H0220089 | 1/1990 |
| TW | 200729650 | 8/2007 |
| WO | WO 01/48874 | 7/2001 |
| WO | WO 2011/020923 | 2/2011 |
| WO | WO 2011/142849 | 11/2011 |

OTHER PUBLICATIONS

Decision of Rejection for from the State Intellectual Property Office of the People's Republic of China for related Application No. 201380077216.1, dated Sep. 5, 2017, 29 pages (w/ English translation) (copy attached).

International Search Report and Written Opinion for International Application No. PCT/US2013/033424, 9 pages, dated Jul. 18, 2013.

International Search Report for International Application No. PCT/US2014/033563, 2 pages, dated Dec. 23, 2014.

International Search Report for International Application No. PCT/US2013/059970, 6 pages, dated Feb. 6, 2014.

Kanskar et al., "High Reliability of High Power and High Brightness Diode Lasers," nLight Corporation, 10 pages (date unknown).

Larsson et al., "Grating Coupled Surface Emitters: Integrated Lasers, Amplifiers, and Beam Shaping Outcouplers," SPIE Conference on Testing, Packaging, and Reliability of Semiconductor Lasers IV, 3626:190-201 (Jan. 1999).

Marciante et al., "Nonlinear Mechanisms of Filamentation in Broad-Area Semiconductor Lasers," IEEE Journal of Quantum Electronics, 32(4):590-596 (Apr. 1996) (copy attached).

Mehuys et al., "Self-Stabilized Nonlinear Lateral Modes of Broad Area Lasers," IEEE Journal of Quantum Electronics, QE-23(11):1909-1920 (Nov. 1987) (copy attached).

Odriozola et al., "Design of 1060 nm Tapered Lasers with Separate Contact," Opt. Quant. Electron, 40:1123-1127 (2008).

Office Action from the State Intellectual Property Office of the People's Republic of China for related Application No. 201480032789.7, dated Sep. 29, 2016, 15 pages (w/ English translation).

Office Action from the State Intellectual Property Office of the People's Republic of China for related Application No. 201380077216.1, dated Nov. 1, 2016, 32 pages (w/ English translation).

Office Action from the State Intellectual Property Office of the People's Republic of China for related Application No. 201480032789.7, dated Mar. 8, 2017, 16 pages (w/ English translation) (copy attached).

Office Action from the Taiwan Patent Office for related Application No. 102136953, dated Jan. 28, 2016, 16 pages.

Second Office Action from the State Intellectual Property Office of the People's Republic of China for related Application No. 201380077216.1, dated Apr. 25, 2017, 27 pages (w/ English translation) (copy attached).

Sumpf et al., "High-Brightness Quantum Well Tapered Lasers," IEEE J. of Selected Topics in Quantum Electronics, 15(3):1009-1020 (May/Jun. 2009).

Sumpf et al., "1060 nm DBR Tapered Lasers with 12 W Output Power and a Nearly Diffraction Limited Beam Quality," Proc. of SPIE, 7230:72301E1-72301E8 (2009).

Third Office Action from the State Intellectual Property Office of the People's Republic of China for related Application No. 201480032789.7, dated Jul. 20, 2017, 13 pages (w/ English translation) (copy attached).

Walpole, Semiconductor Amplifiers and Lasers with Tapered Gain Regions, Optical and Quantum Electronics, 28:623-645 (1996).

Wenzel et al., "High-Brightness Diode Lasers," C.R. Physique, 4:649-661 (2003).

Bartolo, et al. "Mid-infrared angled-grating distributed feedback laser" Applied Physics Letters, 76(22):3164-3166 (May 29, 2000).

Decision of Rejection for from the State Intellectual Property Office of the People's Republic of China for related Application No. 201480032789.7, dated Nov. 30, 2017, 12 pages (w/ English translation).

Demars, et al., "Angled-grating distributed feedback laser with 1 W cw single-mode diffraction-limited output at 980nm," Lasers and Electro-Optics, pp. 77-78 (Jun. 1996).

(56) References Cited

OTHER PUBLICATIONS

Guther, "Beam propagation in an active planar waveguide with an angled bragg grating," Journal of Modern Optics, 45(7):1537-1546 (Jul. 3, 2009).

International Search Report and Written Opinion for related International Application No. PCT/US2016/036080, dated Sep. 8, 2016, 5 pages.

Lang, et al., Theory of Grating-Confined Broad-Area Lasers, IEEE Journal of Quantum Electronics, 24(11):2196-2210 (Nov. 1998).

Paschke, et al., "High power and high spectral brightness in 1060 nm alpha-dfb lasers with long resonators," Electronics Letters, 39(4):369-370 (Feb. 20, 2003).

Paschke, et al., "Properties of ion-implanted high-power angled-grating distributed-feedback lasers," IEEE Journal of Selected Topics in Quantum Electronics, 9(5):1172-1178 (Sep./Oct. 2003).

Sarangan et al., "Spectral Properties of Angled-Grating High-Power Semiconductor Lasers," IEEE Journal of Quantum Electronics, 35(8):1220-1230 (Aug. 1999).

Venus et al., "Spectral stabilization of laser diodes by external Bragg resonator," Venus-SSDLTR, 5 pages (2004).

Wong et al., "Angled-grating distributed-feedback laser with 1.2 W cw single-mode diffraction-limited output at 1.06μm," Laser and Electro-Optics, pp. 34-35 (May 1998).

Zhao, et al., "Folded cavity angled-grating broad-area lasers," Optics Express, 21(20):24087-24092 (Oct. 2013).

Zhao et al., "On-chip coherent combining of angled grating diode lasers toward bar-scale single-mode lasers," Optics Express 20(6):6375-6384 (Mar. 12, 2012).

Zhu et al., Modal Gain Analysis of Transverse Bragg Resonance Waveguide Lasers With and Without Transverse Defects, IEEE Journal of Quantum Electronics, 43(10):934-940 (Oct. 20017).

\* cited by examiner

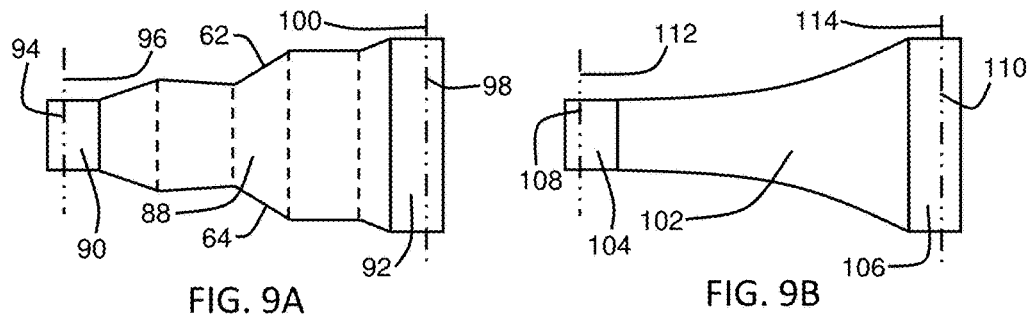
FIG. 9A
FIG. 9B
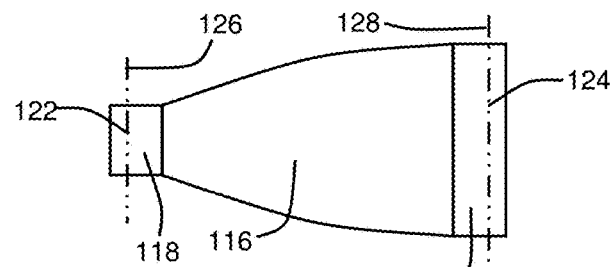
FIG. 9C
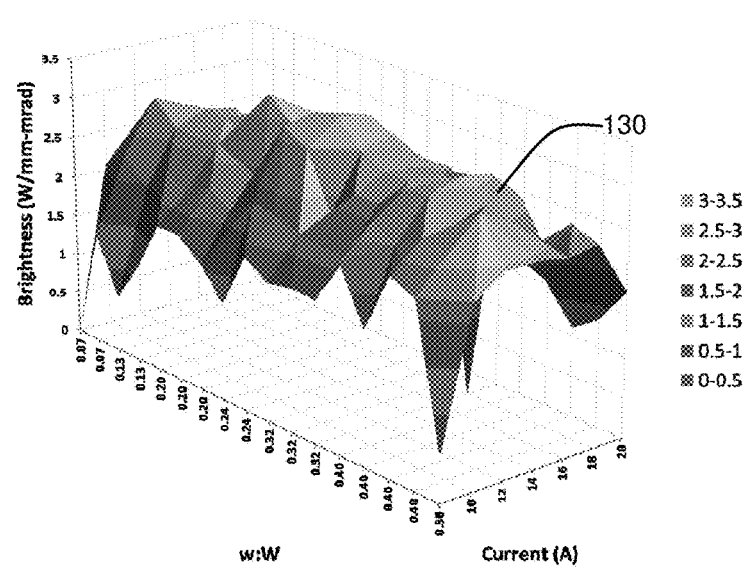
FIG. 10

FLARED LASER OSCILLATOR WAVEGUIDE

CROSS REFERENCE TO RELATED APPLICATIONS

This application is a continuation of U.S. patent application Ser. No. 14/855,710 filed Sep. 16, 2015, which is a continuation of U.S. patent application Ser. No. 14/011,661 filed Aug. 27, 2013, now U.S. Pat. No. 9,166,369, issued Oct. 20, 2015, which claims the benefit of U.S. Provisional Patent Application 61/810,261 filed Apr. 9, 2013, all of which are incorporated herein by reference in their entirety for all purposes.

BACKGROUND OF THE INVENTION

1. Field of the Invention

Generally, the field of the present invention is semiconductor diode lasers. More particularly, the invention relates to flared laser oscillator waveguides.

2. Background

Multimode laser diodes, also known as broad area lasers (BALs), have the property that their slow-axis beam-parameter-product (BPP) and their slow-axis brightness (power÷BPP) degrade progressively when they are driven at higher current to generate higher power. Brightness can be improved in BALs by reducing the emitter width; however, the current at which the maximum brightness occurs also happens at progressively lower current values. Hence, the maximum output power at the maximum brightness also drops. For power-scaling applications and reducing the cost-per-watt of producing diode lasers, higher brightness at higher output power per emitter is very desirable.

Semiconductor diode lasers are formed by growing multiple layers of semiconductor materials on a suitable substrate with a lattice constant that allows choice of materials to produce desired emission wavelengths. A typical semiconductor laser comprises n-type layers, p-type layers and an undoped active layer between them such that when the diode is forward-biased, electrons and holes recombine in the active region layer to produce light. The active layer (quantum well(s), quantum wire(s) or quantum dots, type-II quantum well(s)) resides in the waveguide layer which has a higher index of refraction compared to the surrounding p- and n-doped cladding layers. Light generated from the active layer is confined in the plane of the waveguide.

A conventional edge-emitting Fabry Perot broad area laser diode is arranged as a rectangular gain or index-guided semiconductor structure. Opposing end facets of the waveguide define high and partial reflectors to provide feedback for oscillation of light within the resonator. The multi-layered semiconductor laser diode structure extends the length of the laser and has a broad width for electrical injection extending to opposite side surfaces which also extend the length of the laser. The multi-layered semiconductor materials are typically arranged so that the laser operates in a single mode along the growth direction of the laser and this direction is defined as fast-axis direction. Since along the fast-axis direction the semiconductor laser operates in a single mode, the brightness of laser diode in this direction cannot be improved any further—it is so called diffraction-limited. The distance between the top and bottom surfaces of the multi-layered semiconductor laser structure thus provides the smaller dimension of the end facets, i.e., the thickness of the stripe, typically on the order of microns. On the other hand, the width of the multi-layered laser structure provides the larger dimension of the end facets, i.e., the stripe-width is typically on the order of many tens of microns to hundreds of microns. Because the stripe width is much larger than the wavelength of light, the lateral property of an optical field propagating along the optical axis of the waveguide is highly multimode along the longer stripe dimension and the corresponding axis is described as slow-axis.

Diode laser ridge waveguide structures with single-mode structural characteristics across the slow-axis have been described which may be suitable for lower powers where single-mode performance is desirable. For example, in U.S. Pat. No. 6,014,396 to Osinki et al. a flared semiconductor optoelectronic device is disclosed that has a double-flared structured. Other examples of conventional ridge waveguide structures can be found in U.S. Pat. Nos. 7,623,555 and 6,798,815. These devices have single mode beam quality in both directions but such performance comes at the expense of limited output power. However, the problem of scaling to higher powers while maintaining superior brightness continues to pose a challenge in the art of diode lasers, particularly where devices are highly multimode across the slow axis, and so a need remains for improvements associated therewith.

SUMMARY OF THE INVENTION

Accordingly, the present invention satisfies the aforementioned need by providing an innovation in broad area semiconductor diode laser technology which includes providing a flared laser oscillator waveguide (FLOW) with a flared current injection region extending and widening between a multimode high reflector facet and a partial reflector facet. By narrowing the width of the electrically-pumped stripe towards the high reflector facet, the higher order modes with higher divergence angles are prevented from coupling back into the laser. As a result, the slow-axis divergence of the laser is smaller compared to a device with rectangular geometry having the same width for the partial reflector.

Furthermore, light propagating in the flared current injection region can form a thermal waveguide that is closer to the width of the narrower, high reflector side causing a beam output at the partial reflector facet to have a substantially narrower beam width than the partial reflector facet width. As a result, the-beam-parameter-product, BPP (slow-axis near-field width times the slow-axis divergence) is smaller for FLOW devices compared to BAL devices. Since the near-field is smaller than the physical width at the partial reflector side, FLOW devices can be designed to have a larger total area compared to BAL without sacrificing BPP. The enlarged total pumped area provided by the flaring of the flared current injection region serves to reduce thermal resistance and electrical series resistance in the device, resulting in higher electrical-to-optical power conversion efficiency. This leads to higher output power at a given operating current compared to BAL devices. Higher power and smaller BPP leads to increased beam brightness in the slow-axis.

In addition to the application to broad area diode lasers, the FLOW concept can also be applied to other types of semiconductor-based Fabry-Perot lasers, such as quantum cascade laser (QCL), interband quantum cascade lasers (IQL), by way of example. Broad area diode lasers with flared laser oscillator waveguides can also find particular use in laser diode modules, which can be configured for various applications such as fiber-coupling or direct pumping.

Thus, in one aspect of the present invention, a broad area semiconductor diode laser device includes a multimode high reflector facet, a partial reflector facet spaced from the multimode high reflector facet, and a flared current injection region extending and widening between the multimode high reflector facet and the partial reflector facet, wherein the ratio of a partial reflector facet width to a high reflector facet width is n:1, where n>1.

In another aspect of the present invention, a multimode flared laser oscillator waveguide includes a semiconductor gain volume having a multimode high reflector and an output coupler oppositely disposed and spaced apart by a resonator length, top and bottom oppositely disposed sides spaced apart by a resonator height, and first and second oppositely disposed flared sides spaced apart by a variable resonator width providing the high reflector with a shorter width than the output coupler.

In another aspect of the present invention a flared laser oscillator waveguide includes a semiconductor gain volume which includes a high reflector surface and an opposing partial reflector surface spaced apart from each other by a resonator length, top and bottom opposite surfaces spaced apart by a resonator height, and first and second opposite side surfaces spaced apart by a resonator width, wherein at least a portion of the opposite side surfaces are spaced apart by a variable resonator width forming a flared oscillator region and providing the high reflector surface with a shorter width than the partial reflector surface.

The foregoing and other objects, features, and advantages will become more apparent from the following detailed description, which proceeds with reference to the accompanying figures, which are not necessarily drawn to scale.

BRIEF DESCRIPTION OF THE DRAWINGS

FIGS. 9A-C show top cross-sectional views for three alternative current injection regions in accordance with aspects of the present invention.

FIG. 10 is a three dimensional chart showing current and brightness for different facet width ratios in accordance with an aspect of the present invention.

DETAILED DESCRIPTION OF THE INVENTION

Figure 1:
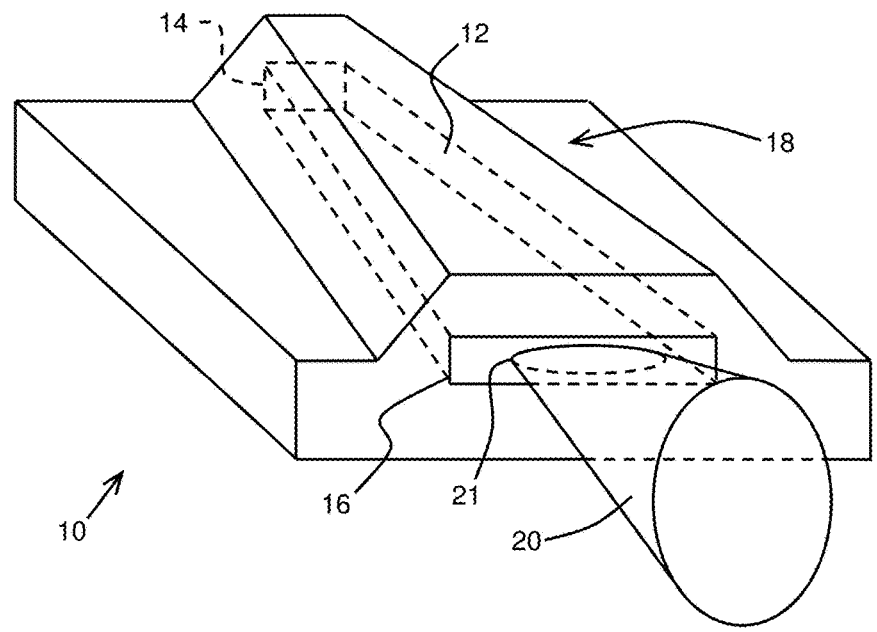
FIG. 1 is a perspective view of flared laser oscillator waveguide device in accordance with an aspect of the present invention.

Referring to FIG. 1, a perspective view is shown of a first embodiment of a broad area flared laser oscillator waveguide (FLOW) device, generally designated 10, in accordance with an aspect of the present invention. The device 10 includes a current injection region 12 for electrical pumping, the region 12 having a trapezoidal shape extending between a high reflecting back facet 14 and a partial reflecting front facet 16. The device 10 can have a ridge, or mesa, shaped structure 18 as depicted in FIG. 1 forming an index-guided region or the shape 18 depicted in FIG. 1 can be gain-guided. The device 10 is configured for emission of a laser beam 20 out of the front facet 16 thereof. A beam spot 21 is formed on the front facet 16 of the device 10 as the beam 20 is emitted therefrom. Ridge structures, particularly active portions thereof, can be made in part from a variety of different conventional semiconductor materials typically grown in layers through conventional semiconductor deposition processes. Exemplary materials include GaAs, AlGaAs, InGaAsP, InGaAs, InP, other elements in the III & V columns, and various combinations thereof. Suitable deposition processes can include CVD, MOCVD, and MBE.

Figure 2:
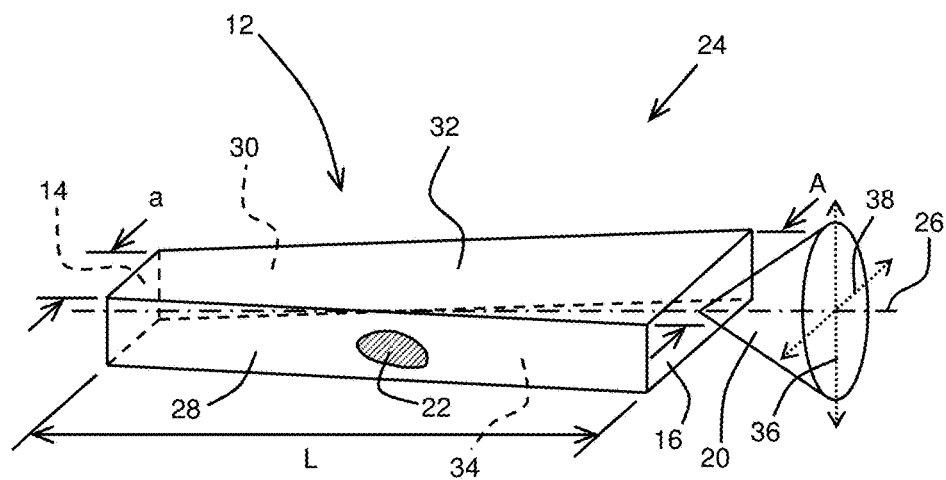
FIG. 2 is a perspective view of an optical resonator of a flared laser oscillator waveguide device in accordance with an aspect of the present invention.

With additional reference to FIG. 2, shown within the ridge structure 18 is an active region 22 formed by the layered semiconductor material. The active region 22 is disposed in, forms a portion of, or defines an optical resonator 24 in which light may oscillate along an optical axis 26 to become amplified. The resonator 24 includes aforementioned back and front facets 14, 16, as well as opposite sides 28, 30. In some examples, the resonator 24 also includes opposite upper and lower surfaces 32, 34 which are coextensive with the current injection region 12 in the device 10. The length of the resonator 24 can be selected for different purposes, such as the end-use application, manufacturing requirements, or optimization requirements. Suitable lengths can include 1 mm or less, 3 mm, 5 mm, 10 mm or more, or other variations thereof. The high reflecting back facet 14 has a narrower width 'a' than a width 'A' of partial reflecting front facet 16. Importantly, in examples herein both facets 14, 16 have widths that are highly multimode. Thus, for optical wavelengths around 1 µm (e.g., 976 nm), the back facet 14 can have a minimum width 'a' as low as approximately 10 µm, but is preferably around 30 to 75 µm, with other examples also being discussed herein. Other wavelengths are also possible, resulting in different widths, lengths, or other dimensions. Suitable reflectivities for high reflecting back facet 14 includes a reflectivity of 99% or more, but the reflectivity can be selected to be lower as needed. The partial reflecting front facet 16 couples light out of the optical resonator 24 and has a larger width typically associated with conventional broad stripe diode lasers. For example, suitable widths 'A' for the front facet 16 include 25 μm, 50 μm, 75 μm, 150 μm, or larger. The thickness of the facets 14, 16, as well as the thickness of the remainder of the optical resonator 24 is typically uniform, and on the same order as the optical wavelengths. For optical wavelengths of around 1 μm, the thickness of the stripe is typically on the order of a couple of microns. For example, one such device can include a 0.75 μm n-cladding, a 1.5 μm waveguide with quantum well imbedded therein, 1 μm p-waveguide, and 0.1 μm highly doped contact layer. Variations in thickness are also possible. Typical reflectivities for the partial reflecting front facet 16 include between 0.05% and 15%, but may be selected or tuned as needed in accordance with the desired output characteristics of the device 10.

Representative beam 20 is also shown being emitted from front facet 16 of optical resonator 24 in FIG. 2. The beam 20 is highly divergent across a fast axis 36 and has a relatively slow divergence across a slow axis 38. The beam 20 is highly divergent across fast axis 36 due to the small thickness of the resonator 24. The beam 20 is slowly divergent across slow axis 38 due to the relatively large minimum width 'a' of the resonator 24. Collimation and redirection optics (not shown) can be positioned in the path of the emitted beam 20 to collimate and direct the beam 20 for subsequent application, such as combining beam 20 with other diode laser beams for coupling into an optical fiber or gain medium.

The beam parameter product (BPP) and beam brightness are important characteristics for laser pumping and for other applications of the device 10. The beam parameter product is a measure of beam quality and is given by the product of the divergence angle of a beam with its waist radius. Minimum beam parameter products are desirable for many applications. In typical broad stripe diode structures slow axis BPP increases as injected current increases due to increase in far-field divergence angle, leading to less desirable beam characteristics as the diodes are driven to higher output powers. Beam brightness is a measure of diode performance and is given by the quotient of beam power and BPP. A higher brightness is desirable for many laser applications, particularly for higher power applications like brightness conversion in fiber lasers. It is also important for optically coupling light into fibers more generally. Brightness is typically approximately flat or increases somewhat as a function of input current for conventional broad area laser diodes.

Figure 3:
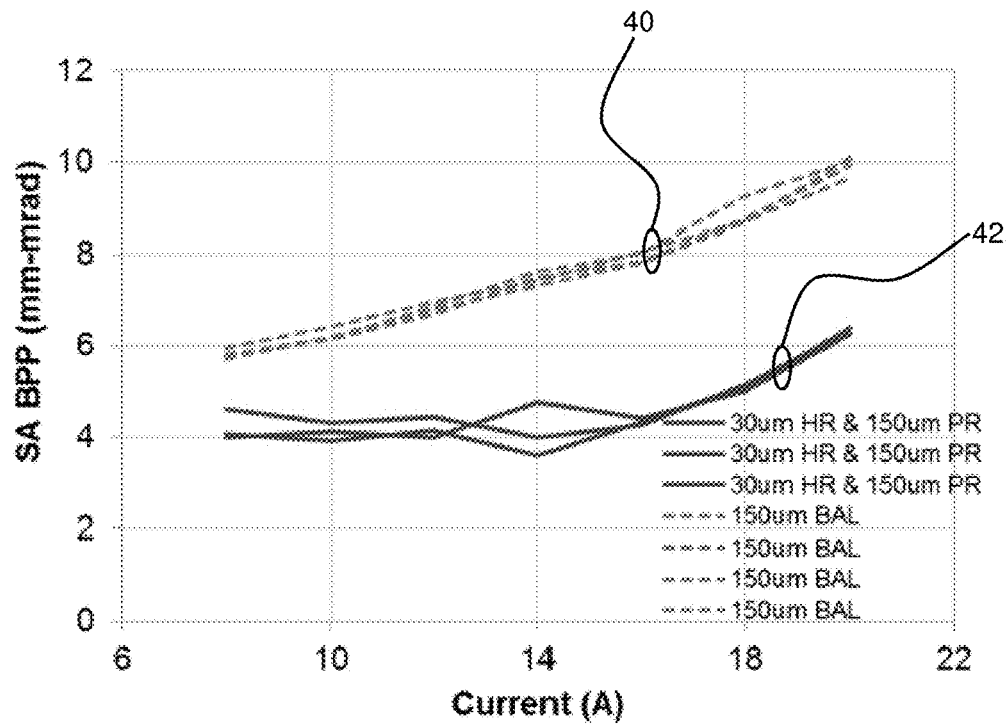
FIG. 3 is a chart of slow-axis (SA) beam parameter product (BPP) for conventional broad area diode laser devices and flared laser oscillator waveguide diode laser devices in accordance with aspects of the present invention.

For example, a BPP-current relation 40 is shown in FIG. 3 for the slow axis of beams emitted from four conventional broad area laser diodes having a constant width (i.e., 'a'='A') of 150 μm along the lengths thereof. The relation 40 shows a BPP of approximately 6 mm-mrad at 8 amps which rises steadily to 10 mm-mrad at 20 amps. In contrast, a BPP-current relation 42 is shown for three example devices 10 having an 'a' dimension of 30 μm for high reflecting back facet 14 and an 'A' dimension of 150 μm for partial reflecting front output facet 16 and a constant linear change in resonator width therebetween. The BPP of beams for the three example flared devices 10 is approximately 4 mm-mrad at 8 amps up to approximately 16 amps where BPP rises steadily to approximately 6 mm-mrad at 20 amps. Thus, devices 10 in accordance with aspects of the present invention are operable to deliver enhanced BPP performance compared with conventional broad area laser diodes over a portion or the entirety of the diode laser device operational range. In some examples, and also in relation to input current, devices 10 can provide 10%, 20%, or even 50% or more of improvement in BPP over conventional broad area laser diodes.

Figure 4:
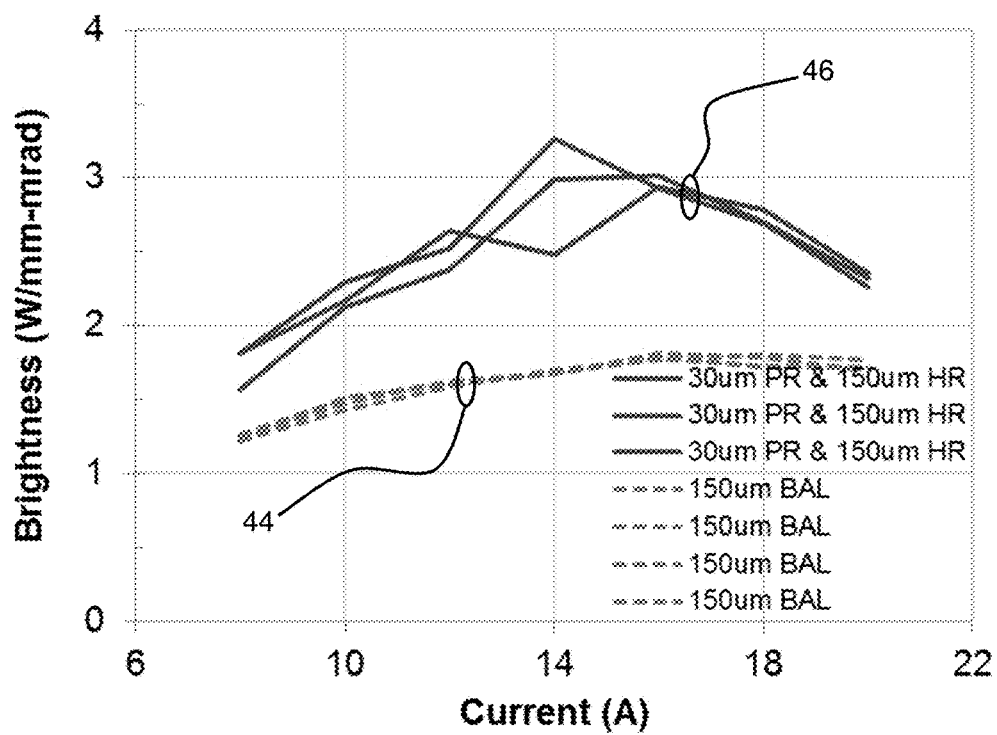
FIG. 4 is a chart of slow-axis (SA) brightness for conventional broad area diode laser devices and flared laser oscillator waveguide diode laser devices in accordance with aspects of the present invention.

In addition to substantial improvement in BPP, brightness of devices 10 in accordance with aspects of the present invention can also experience substantial gains in unexpected fashion. For example, a brightness-current relation 44 is shown in FIG. 4 for the slow axis of beams emitted from the four conventional broad area laser diodes described with reference to FIG. 3 above. The relation 44 shows brightness in the range of approximately 1.2 to 1.8 W/mm-mrad from 8 amps to 20 amps. In contrast, a brightness-current relation 46 is shown for the three example devices 10 described with reference to FIG. 3 above. The brightness of beams for the three example flared devices 10 is approximately 2 W/mm-mrad at 8 amps increasing to over 3 W/mm-mrad at 14 amps and descending to approximately 2.4 W/mm-mrad at 20 amps. Thus, devices 10 in accordance with aspects of the present invention are operable to deliver enhanced brightness performance compared with conventional broad area laser diodes over a portion or the entirety of the diode laser device operational range and for similar aperture sizes. In some examples, and also in relation to input current, devices 10 can provide 10%, 20%, 50%, or even 100% or more of improvement in brightness over conventional broad area laser diodes.

Figure 5:
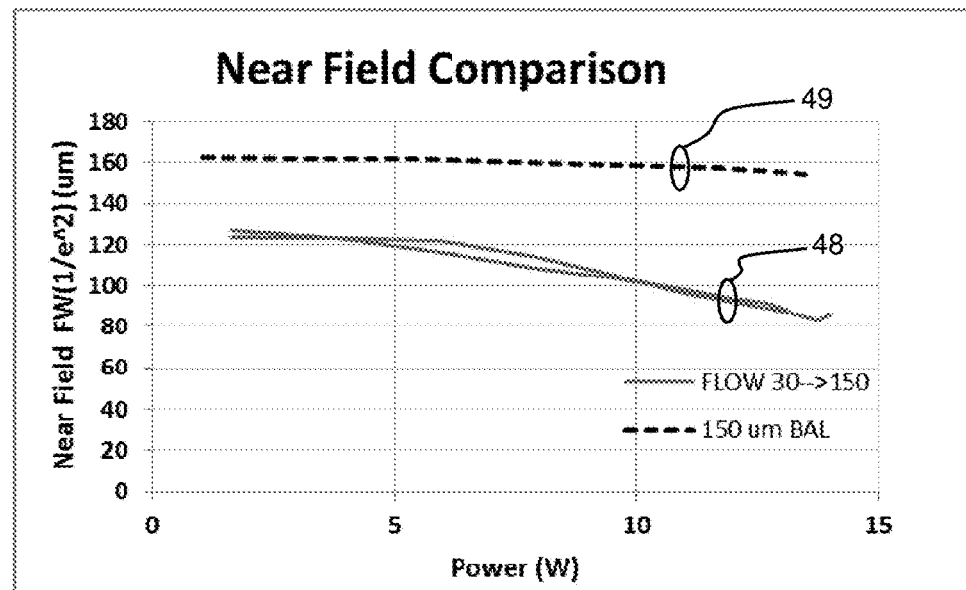
FIG. 5 is a chart showing near field beam width shrinking as a function of operating power for beams emitted from flared laser oscillator waveguide diode laser devices in accordance with aspects of the present invention compared to a broad area laser.
Figure 6:
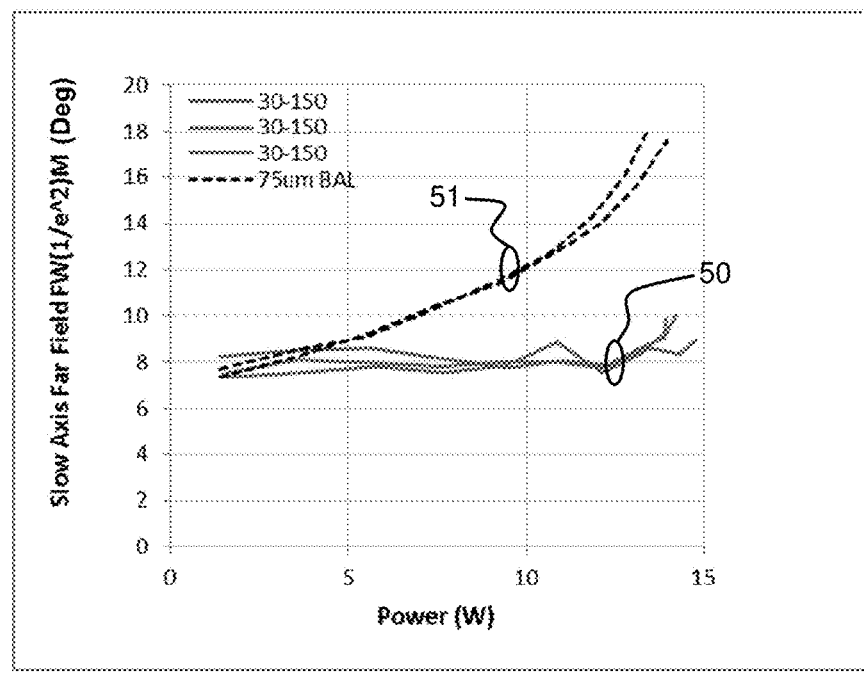
FIG. 6 is a chart showing far field beam divergence as a function of operating power for beams emitted from conventional broad are diode laser devices and flared laser oscillator waveguide diode laser devices in accordance with aspects of the present invention.

The substantial improvements in BPP and brightness can be attributed in part to the near field performance of beams emitted by devices 10. FIG. 5 is a plot of full-width at $1/e^2$ value of the normalized intensity profiles across the slow axis of beams emitted by a device 10 with dimensions described with reference to FIGS. 3 and 4 for different selected power levels ranging from 2 watts to 14 watts. It can be seen that the widths of the beams are consistently smaller by 20% or more and decrease more rapidly for flared laser oscillator waveguide diodes 48 compared to 150 μm broad area lasers 49 as the power increases. Moreover, with additional reference to FIG. 6, the slow-axis far-field divergence 50 of flared laser oscillator waveguide devices start at about 8 degrees at full-width at $1/e^2$ value and remain nearly constant from threshold to 14 watts. For this same operating power range, a 75 μm BAL device slow-axis far-field divergence 51 increases non-linearly from 8 degrees at full-width at $1/e^2$ value at 2 watts to over 18 degrees at full-width at $1/e^2$ value at 14 watts. Improved BPP over conventional devices is attributed to a smaller amount of far field bloom seen in the emitted beam 20 as well as narrower near-field profile compared to BALs. The reduction in near-field bloom can be associated with the increased optical intensity of the beam 20 at the flared front facet 16 and its effective width has narrowed due to guiding and mode stripping caused by the tapered back facet 14. Thus, the output beam 20 typically emits in a spot 21 from the front facet 16 across less than the whole width 'A' thereof.

Figure 7:
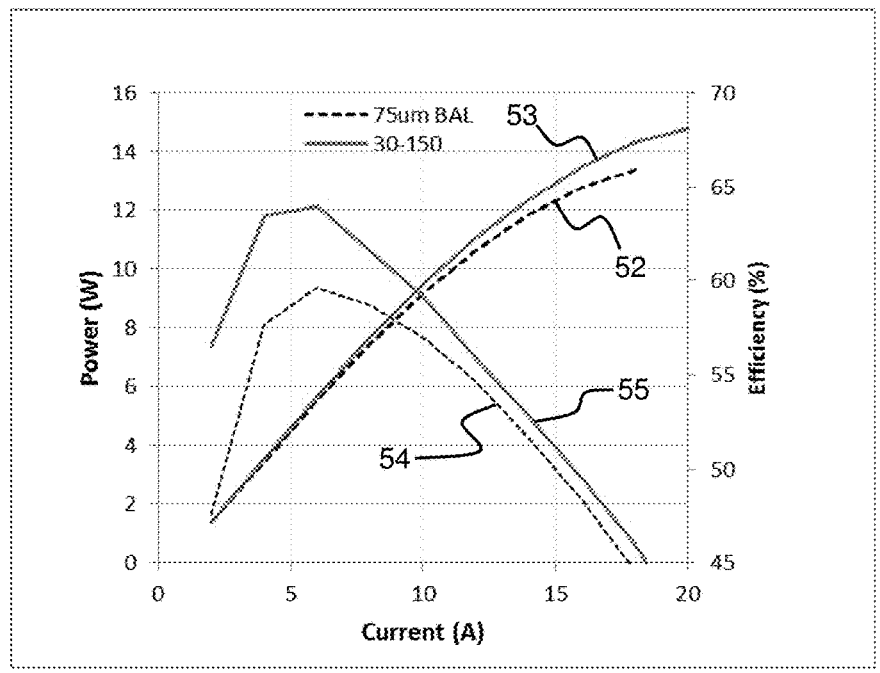
FIG. 7 is a chart showing optical power (Power) as well as electrical-to-optical power conversion efficiency (Efficiency) versus current curves for flared laser oscillator waveguide devices of the present invention and conventional broad area laser diodes.

By selecting the HR back facet 14 to have a narrower width than the PR front facet 16 (i.e., a<A), lateral mode control is introduced into the device 10. Also, the HR back facet 14, as opposed to the PR front facet 16, is selected to have a narrower width since higher order modes reflected at the facet 14 are diffracted at an angle such that the higher order modes do not propagate back into the electrically-pumped region of the device 10. Accordingly, fewer lateral optical modes are propagated in a device 10 across the slow axis compared to a conventional straight broad area laser diode having the same width 'A' for PR output facet 16. Additionally, as the fewer mode light propagates back through the resonator 24, a thermal waveguide is formed therein running the length of the resonator 24 and having a width that is closer to the width 'a' of the narrower high reflecting back facet 14. The corresponding narrower thermal waveguide limits the effective spot size of the beam 20 to a substantially narrower spot 21 as the beam exits the front facet 16. The substantially narrower spot 21 can be narrower by 5%, 20%, 50% or more, for example, and is typically dependent on the input current to the device 10, as illustrated in FIG. 5. The fewer mode thermally guided light emits as a beam 20 that has higher slow axis brightness than conventional broad area laser diodes having the similar exit aperture width. As will be seen hereinafter, due to the lateral mode control introduced by the back facet 14 aperture, the total current-injected area of the device 10 can be optimized to lower both the thermal and electrical resistance thereof for improved performance. Moreover, by flaring the shape of the optical resonator 24 and current injection region 12, the total electrically-pumped area is an enlarged area that does not compromise slow-axis BPP thereby improving the overall thermal resistance and electrical series resistance of the device 10. Consequently, devices 10 achieve higher peak efficiency compared to conventional broad area diode lasers with equal output aperture size yet produce higher output power at the same brightness as illustrated in FIG. 7. Since the size of the output beam 20 is not determined by the pumped output aperture width, the effective area of devices 10 can be larger and therefore the series resistance of the devices 10 can be commensurately lower.

Referring to FIG. 7 a chart is shown of output optical power and electrical-to-optical power conversion efficiency (PCE) as a function of input current for a device 10 having a 30 µm to 150 µm flared current injection configuration and a conventional BAL with a constant width of 75 µm, both devices having a 5 mm cavity length. The output optical power 52 for the 75 µm BAL performs similar to or slightly worse than the output optical power 53 for a flared device 10. The PCE, designated 54, for the 75 µm BAL depicts a similar to or slightly worse result than the PCE, designated 55, for the flared device 10.

Figure 8A:
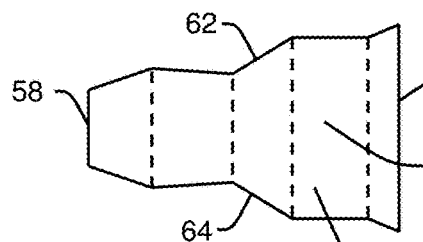
FIGS. 8A-C show top cross-sectional views for three alternative current injection regions in accordance with aspects of the present invention.
Figure 8B:
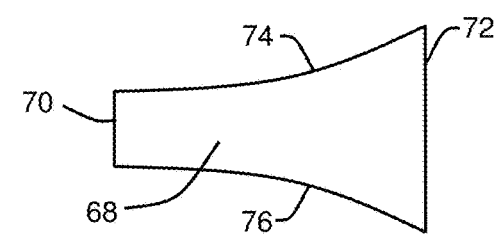
Figure 8C:
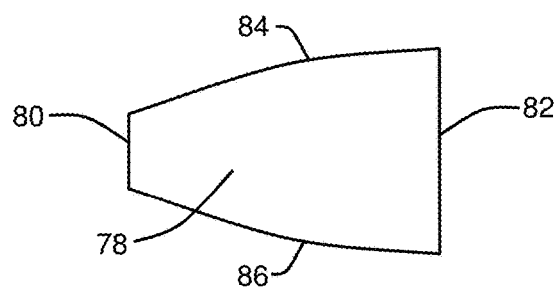

Referring now to FIGS. 8A-8C, there are shown several examples of current injection regions of alternative embodiments of FLOW devices. With particular reference to FIG. 8A, a top view is shown of a trapezoidal perimeter of a current injection region 56 of an alternative embodiment of a flared laser oscillator waveguide device in accordance with an aspect of the present invention. The current injection region 56 has a narrower width for a high reflecting back facet 58, a larger width for a partially reflecting front facet 60, and segmented flat opposing side surfaces 62, 64 extending between the facets 58, 60. The current injection region 56 includes a plurality of flared regions 66 of different widths, though each flared region 66 is wider than the high reflecting back facet 58. In FIG. 8B, a top view is shown of a perimeter of an inward curved current injection region 68 of another alternative embodiment of a flared laser oscillator waveguide device in accordance with an aspect of the present invention. The current injection region 68 has a narrower width for a high reflecting back facet 70, a larger width for a partially reflecting front facet 72, and a pair of smooth flared side surfaces 74, 76 extending between the facets 70, 72. In FIG. 8C, a top view is shown of a perimeter of an outward curved current injection region 78 of another alternative embodiment of a flared laser oscillator waveguide device in accordance with an aspect of the present invention. The current injection region 78 has a narrower width for a high reflecting back facet 80, a larger width for a partially reflecting front facet 82, and a pair of smooth flared side surfaces 84, 86 extending between the facets 80, 82. Various combinations of shapes described for regions 56, 68, 78 are also possible.

Referring now to FIGS. 9A-9C, additional examples are shown of current injection regions which are similar to the regions shown in FIGS. 8A-8C and to which reference shall be made with respect to like numerals. Thus, in FIG. 9A, a top view of a current injection region 88 is shown for an alternative embodiment of a flared laser oscillator waveguide device, the region 88 being similar to current injection region 56 having a plurality of flared regions 66 to the extent that region 88 also includes a plurality of flared regions 66. Region 88 also includes narrower and wider end rectangular portions 90, 92 extending from the respective opposite narrower and wider end regions 66 of region 56. The narrower end rectangular portion 90 extends a predetermined distance allowing a high reflecting back facet 94 to be formed, e.g., through cleaving along a cleave plane 96, that has a well-defined aperture. Because the rectangular portion 90 has a constant width parallel to the cleaving plane 94, variation in the location of the cleaving plane 94 does not affect the selected width of the back facet 94. The wider end rectangular portion 92 extends a predetermined distance allowing a partially reflecting front facet 98 to be formed, e.g., through cleaving along a cleave plane 100, that also has a well-defined aperture. In FIG. 9B, a current injection region 102 has a inwardly curved middle portion extending between a narrower end rectangular extension 104 and a wider end rectangular extension 106. The rectangular extensions 104, 106 extend predetermined distances allowing respective high reflecting back and front facets 108, 110 to be formed at respective cleaving planes 112, 114, so as to provide the formed facets 108, 110 with well-defined apertures. In FIG. 9C, a current injection region 116 has a outwardly curved middle portion extending between a narrower end rectangular extension 118 and a wider end rectangular extension 120. The rectangular extensions 118, 120 extend predetermined distances allowing respective high reflecting back and front facets 122, 124 to be formed at respective cleaving planes 126, 128, so as to provide the cleaved facets 122, 124 with well-defined apertures.

With respect to embodiments described in FIGS. 9A-9C, the various segmented and curved shapes can be combined in various ways, and rectangular extensions can be added or defined for one or both ends of a current injection region of a device. The rectangular extending portions can be advantageous in manufacturing by providing predictability with respect to the apertures of the back and front facets. A cleaving plane can be coplanar or approximately coplanar with the defined exposed end of the corresponding rectangular extending portion, or alternatively the cleaving plane can be as depicted in FIGS. 9A-9C at a distance from the defined exposed end along the predetermined length of the rectangular extending portion. Thus, while error may be allowed in the precise location of a cleave plane, the well-defined width of the facet is maintained. Moreover, the cleave planes and corresponding facets formed thereby need not be perpendicular to the current injection region or optical axis thereof allowing for angular cleaves, etc.

Various examples of the flared laser oscillator waveguide devices in accordance with the present invention can be gain-guided or index-guided which can be implemented in different ways, though the methods described herein are not intended as exhaustive. For example, in a gain-guided design, a p-contact can be delineated in accordance with the top view current injection region perimeters described in FIGS. 8A-9C. The pattern of the p-contact is formed by making an opening in one or more layers of dielectric of the flared laser oscillator waveguide device 10. A p-contact is then deposited to form the pattern as described hereinabove. Alternatively, a deposited p++ doped contact layer can be etched away where the contact is not desired, i.e., outside of a current injection region perimeter, so as to define a current-blocking Schottky barrier. One suitable way to fabricate an index-guided design includes etching away deposited semiconductor material down a predetermined distance, such as 0.5 µm, 1 µm, 2 µm, or another selected thickness dependent on the structure of the device 10. By etching away the semiconductor material outside the current-injected area, an index contrast is introduced at the etched step in the lateral (slow-axis) direction In FIG. 10 is shown a three dimensional optimization curve 130 depicting multiple flared laser oscillator waveguide devices 10 having a constant changing current injection region width, such as depicted in FIGS. 1-2, but for different ratios of back facet width to front facet width. Current and slow-axis brightness are also axes for the curve 130 so that corresponding optimized designs can be understood for specified ranges of brightness or injection current. Accordingly, in some examples, the widths of the back and front facets are selected in accordance with an optimized facet width ratio.

Figure 11A:
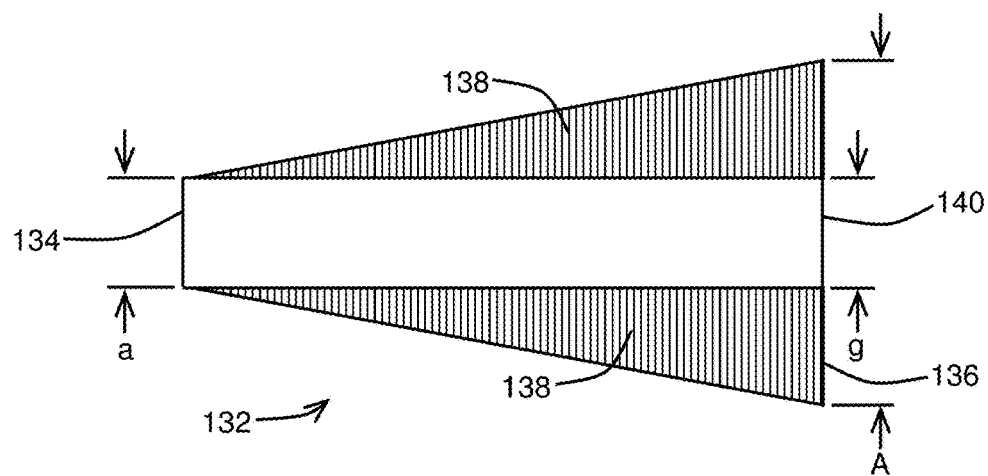
FIGS. 11A-C show top cross-sectional views for three alternative current injection regions and additional higher order mode discriminating features in accordance with aspects of the present invention.
Figure 11B:
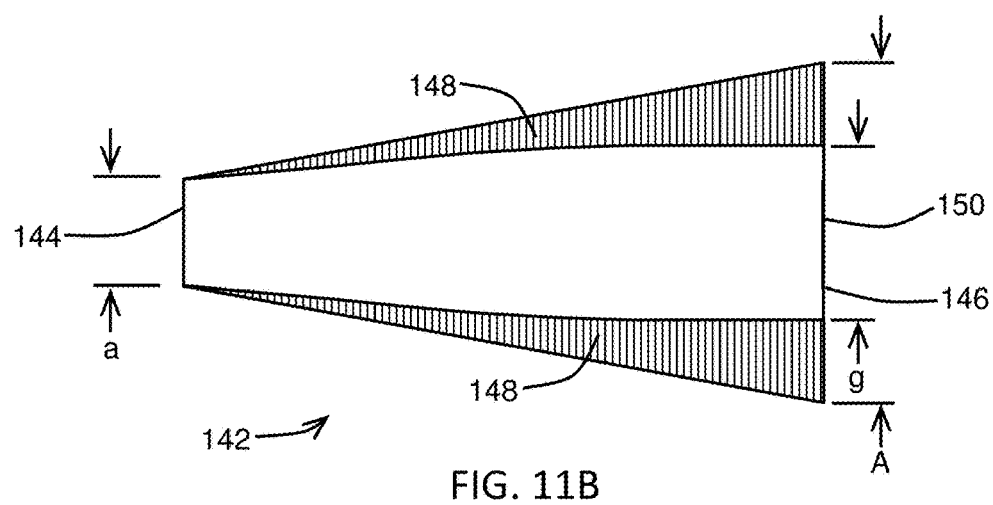
Figure 11C:
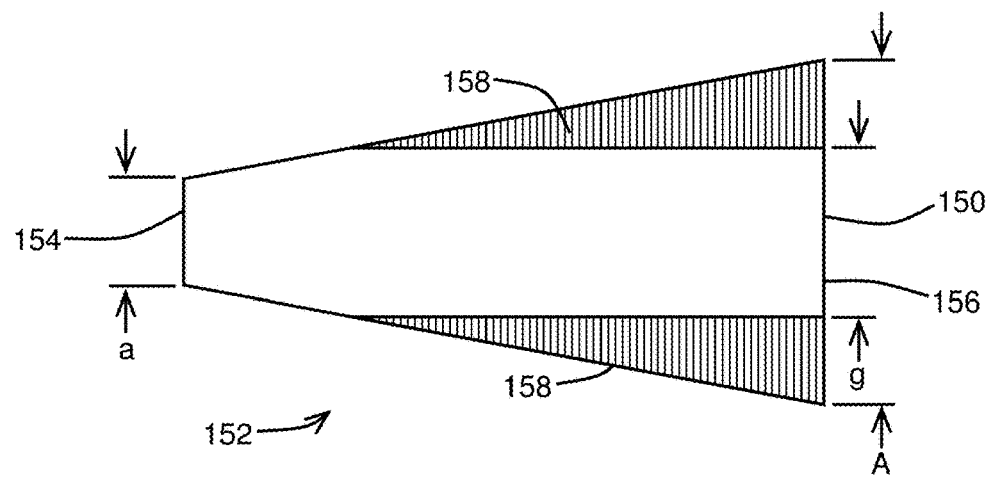

FIGS. 11A-11C illustrate top cross-sectional views of additional embodiments of flared laser oscillator waveguide devices in accordance with aspects of the present invention. In FIG. 11A a flared current injection region 132 is shown extending between a high reflecting back facet 134 with a width 'a' and partial reflecting front facet 136 with a width 'A'. A pair of scattering elements 138 is oppositely positioned in the current injection region 132 and extends between the back facet 134 and the front facet 136. The scattering elements 138 each have a selected width with respect to the width 'A' of the front facet 136 such that a portion 140 of the front facet 136 which does not have scattering elements 138 associated therewith has a smaller width 'g'.

Difference between back facet width 'a' and portion width 'g' is also possible, as illustrated in the alternative embodiments shown in FIGS. 11B and 11C. In FIG. 11B, a flared current injection region 142 also has a back facet 144 with corresponding width 'a' and front facet 146 with a corresponding width 'A'. Current injection region 142 includes lateral scattering elements 148 extending between the back facet 144 and front facet and defining a portion 150 of the front facet 146 with a width 'g' where scattering elements 148 are not present at the interface thereof. Also, scattering elements 148 include a non-linear variation in width, here an interior curved contour, extending between the back and front facets 144, 146.

In FIG. 11C, a flared current injection region 152 also has a back facet 154 with corresponding width 'a' and front facet 156 with a corresponding width 'A'. A pair of scattering elements 158 is oppositely positioned in the current injection region 152 and extends from the front facet 146 to a predetermined distance along the length of the current injection region 152. Also, the scattering elements 158 each have a selected width with respect to the width 'A' of the front facet 156 such that a portion 160 of the front facet 156 which does not have scattering elements 158 associated therewith has a smaller width 'g'. As it will be appreciated by those with skill in the art in view of this disclosure, different variations and combinations of the scattering elements described in FIGS. 11A-11C are possible, including incorporation of other aspects of the present invention herein described.

Various scattering patterns, such as scattering elements 138, 148, 158, are defined in flared laser oscillator waveguide devices of the present invention in order to introduce loss of higher order modes of laser light propagating therein for improved beam output. While different geometric examples are described, the scattering patterns can generally be configured to overlap the modal content of the laser light to achieve higher order mode suppression. Scattering patterns can be formed in a variety of ways to realize mode-stripping effects, including the non-resonant grating, formation of micro-structures that include features with index contrast, or formation of a second-order grating, in the selected patterned area.

Figure 12A:
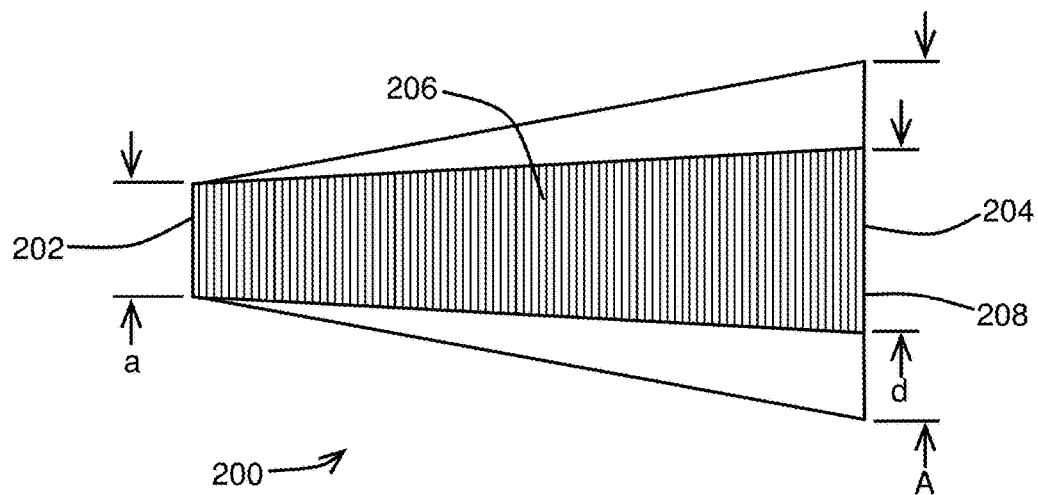
FIGS. 12A-B show top cross-sectional views for two alternative current injection regions and wavelength-stabilizing grating in accordance with aspects of the present invention. 12A shows distributed feedback (DFB) configuration and 12B shows distributed Bragg reflection (DBR) configuration.
Figure 12B:
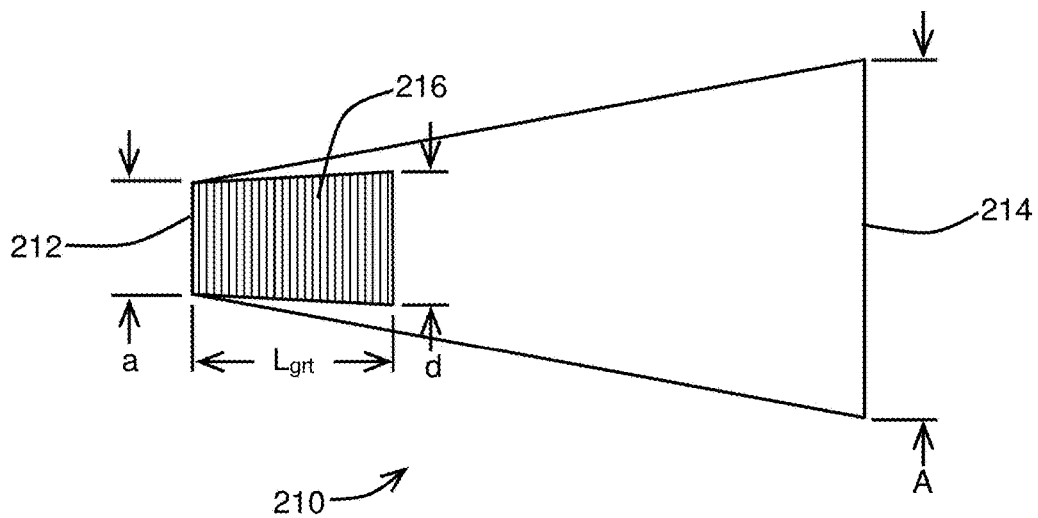

Referring now to FIGS. 12A-12B there are shown additional embodiments of flared laser oscillator waveguide devices in accordance with aspects of the present invention. In FIG. 12A a top cross-sectional view of a current injection region 200 of a flared laser oscillator waveguide device is shown which is configured to be wavelength stabilized. Current injection region 200 includes narrower high reflecting back facet 202 having a width 'a' and a partial reflecting front facet 204 having a width 'A'. A distributed feedback grating 206 is disposed in the flared current injection region 200 so as to extend between the back and front facets 202, 204. Distributed feedback grating 206 can have a variable width as it extends between the facets 202, 204. Moreover, the grating 206 can have a width 'd' at the partial reflecting front facet 204 to define a grating end portion 208 which need not have the same width 'a' as the high reflecting back facet 202.

While in conventional distributed feedback semiconductor laser diode devices the width of the grating at the front facet is typically coextensive with the width of the front facet and the area of the grating is coextensive with the pumped area of the diode, in devices in accordance with the present invention the width 'd' of the grating 206 can be selected to be the same or preferably narrower than the width 'A' of the front facet 204. In some examples the width of the grating 206 varies along the length of the region 200. Since the grating 206 has a smaller area than the entirety of region 200, the total scattering loss introduced by imperfections in the grating is reduced, leading to improved operating efficiency.

In FIG. 12B a top cross-sectional view of a current injection region 210 of a flared laser oscillator waveguide device is shown which is also configured to be wavelength stabilized. The region 210 includes a narrower high reflecting back facet 212 having a width 'a' and a partial reflecting front facet 214 having a width 'A'. A distributed Bragg reflector grating 216 is disposed in the region 210 at the high reflecting back facet 212. The grating 216 extends the width 'a' of the back facet 212 at the back facet 212, extends a length '$L_{grt}$' along the longitudinal axis of the device, and extends to a width 'd' inside the region 210. As can be seen from FIG. 12B, the width of 'd' need not be equal to 'a'. In most cases d>a and the width of 'd' can stretch all the way to the lateral dimension of the pumped region at the location where $L_{grt}$ ends. In some examples, the area of the grating 216 is electrically-pumped with current during operation. The length of the distributed Bragg reflector grating 216 is selected to provide high reflectivity (>90%).

It is thought that the present invention and many of its attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. An apparatus, comprising:
a high reflector (HR) facet;
a partial reflector (PR) facet spaced from the HR facet and situated to emit a multimode output beam; and
a flared semiconductor cavity extending between the HR facet and the PR facet and defining respective widths of the HR facet and the PR facet, wherein the HR facet width is smaller than the PR facet width.

2. The apparatus of claim 1, wherein the HR facet width is selected so as to decrease a number of lateral modes supported by the flared semiconductor cavity and maintain the multimode output beam as multimode across a slow axis corresponding to the direction of the PR facet width.

3. The apparatus of claim 1, wherein the multimode output beam at the PR facet has a slow axis beam width that is smaller than the PR facet width and wherein the slow axis beam width and a single contact total pumping area of the flared semiconductor cavity associated with the difference in the PR facet width and the HR facet width reduce a thermal resistance and electrical series resistance and increase a beam brightness and/or reduce a slow axis beam parameter product of the multimode output beam at a selected power of the multimode output beam.

4. The apparatus of claim 1, wherein the HR facet width is associated with a reduced slow axis beam parameter product of the multimode output beam.

5. The apparatus of claim 1, wherein the HR facet width is associated with an increased brightness of the multimode output beam.

6. The apparatus of claim 1, wherein the flared semiconductor cavity and decrease in the HR facet width are associated with a smaller and/or lower change of a slow axis near field width for increasing power of the multimode output beam.

7. The apparatus of claim 1, wherein the flared semiconductor cavity and the difference between the HR facet width and the PR facet width are associated with a reduced degradation of a slow axis far field divergence for increasing power of the multimode output beam.

8. The apparatus of claim 1, wherein the flared semiconductor cavity and the difference between the HR facet width and the PR facet width are associated with a reduced degradation of a power conversion efficiency for increasing power of the multimode output beam.

9. The apparatus of claim 1, wherein the flared semiconductor cavity and the difference between the HR facet width and the PR facet width are selected based on a brightness of the multimode output beam in a predetermined range of injected current.

10. The apparatus of claim 1, wherein the flared semiconductor cavity and the difference between the HR facet width and the PR facet width are selected so as to filter higher order lateral modes supported at the PR facet.

11. A method for making the apparatus of claim 1, comprising:
depositing a plurality of semiconductor layers so as to form the flared semiconductor cavity.

12. The method of claim 11, further comprising:
selecting the difference between the HR facet width and the PR facet width so as to decrease the number of lateral modes supported by the flared semiconductor cavity while maintaining the multimode output beam as multimode across the slow axis.

13. The method of claim 11, comprising one or more deposition processes, including chemical vapor deposition, metal-organic chemical vapor deposition, and molecular beam epitaxy.

14. The method of claim 11, wherein one or more of the semiconductor layers include one or more of GaAs, AlGaAs, InGaAsP, InGaAs, and InP.

15. The method of claim 11, wherein the depositing includes forming a ridge waveguide that includes the flared semiconductor cavity.

16. The method of claim 11, wherein the depositing includes form one or more quantum well layers in the flared semiconductor cavity.

17. The method of claim 11, wherein the depositingincludes forming at least one scattering element extending into the flared semiconductor cavity.

18. The method of claim 17, wherein the at least one scattering element includes a variable width with respect to a length direction of the flared semiconductor cavity.

19. The method of claim 17, wherein the at least one scattering element is situated to remove higher order lateral modes supported by the flared semiconductor cavity.

20. The method of claim 11, wherein the depositing defines the flared semiconductor cavity as index-guided or gain-guided.

* * * * *